United States Patent
Nomura

(10) Patent No.: US 12,181,267 B2
(45) Date of Patent: Dec. 31, 2024

(54) MEASURING METHOD

(71) Applicant: DISCO CORPORATION, Tokyo (JP)

(72) Inventor: Yasukuni Nomura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 192 days.

(21) Appl. No.: 18/156,573

(22) Filed: Jan. 19, 2023

(65) Prior Publication Data
US 2023/0243639 A1 Aug. 3, 2023

(30) Foreign Application Priority Data

Jan. 31, 2022 (JP) .................................. 2022012783

(51) Int. Cl.
*G01B 11/06* (2006.01)

(52) U.S. Cl.
CPC .................................. *G01B 11/06* (2013.01)

(58) Field of Classification Search
CPC ................ G01B 2210/48; G01B 11/06; G01B 11/0608; G01B 11/026; G01B 11/22; G01B 11/0691; G01B 9/0203; G01B 17/06; G01N 21/9501; G01N 2291/02854; H01L 22/12; H01L 21/67253; G06T 2207/30148
USPC ............ 356/630–632, 503, 237.1–237.5, 73, 356/625–635, 485, 614–613, 908; 250/559.27, 559.19; 702/155, 166, 170
See application file for complete search history.

(56) References Cited

U.S. PATENT DOCUMENTS

| | | | | |
|---|---|---|---|---|
| 4,860,229 A * | 8/1989 | Abbe | ................ | H01L 21/67271 73/104 |
| 6,912,056 B2 * | 6/2005 | Hyun | ................ | G01B 11/0641 356/369 |
| 6,940,592 B2 * | 9/2005 | Borden | ............. | G01N 21/9501 250/559.27 |
| 2003/0022400 A1 * | 1/2003 | Nomoto | ................ | B24B 49/12 356/630 |
| 2004/0090639 A1 * | 5/2004 | Kubo | .................... | G01B 21/30 257/E21.525 |
| 2008/0180697 A1 * | 7/2008 | Sawabe | ............. | B23K 26/0861 356/630 |

FOREIGN PATENT DOCUMENTS

JP 2017199845 A 11/2017

* cited by examiner

*Primary Examiner* — Hoa Q Pham
(74) *Attorney, Agent, or Firm* — Greer Burns & Crain Ltd.

(57) ABSTRACT

A measuring method includes storing thickness data of each of chips held on a holding surface of a holding table, the thickness data being obtained by measurement of thicknesses of portions of the chip at a plurality of measurement points and representing the thicknesses measured at the measurement points in association with positions of the measurement points in a predetermined plane corresponding to a reverse side of the wafer, storing positions of central lines of dividing grooves in the predetermined plane in captured images of reverse sides of the chips, setting, in a periphery of each of the chips, a thickness data unreferencing zone including measurement points where the thickness data will not be referenced in calculating the thickness of the chip, and calculating, for each of the chips, an average value of thicknesses at the measurement points except for the measurement points included in the thickness data unreferencing zone.

2 Claims, 10 Drawing Sheets

MEASURING METHOD

BACKGROUND OF THE INVENTION

Field of the Invention

The present invention relates to a measuring method and a measuring apparatus for measuring the thicknesses of a plurality of chips.

Description of the Related Art

Device cips, hereinafter simply referred to as "chips," are manufactured from a wafer as follows. Devices such as integrated circuits (ICs) are constructed on a face side of the wafer in respective rectangular areas that are demarcated by a grid of projected dicing lines or streets on the face side, for example. The wafer is then divided along the projected dicing lines into chips that include the respective devices. After the wafer has been divided into the chips, the thicknesses of the chips are measured to inspect whether or not the thicknesses fall within an allowable range. There has also been known a method of assessing the thicknesses of respective chips to be divided from a wafer by measuring the thicknesses of respective areas of the wafer before the wafer is divided into the chips, for example (see JP 2017-199845A).

Wafer thickness measurements are usually taken by use of an optical thickness measuring instrument on a wafer out of contact therewith. For example, the wafer is held under suction on a chuck table. Then, the chuck table is rotated about its central axis while a measurement light beam is applied from the optical thickness measuring instrument. The optical thickness measuring instrument is moved to move the spot of the measurement light beam on the wafer linearly and radially inwardly from a radially outer position toward a radially inner position on the rotating wafer. Therefore, the spot, i.e., a measurement point where a wafer thickness is measured, is moved along a spiral path on the wafer. The positional information regarding each of the measurement points along the spiral path on the wafer is obtained from the information regarding angles of rotation of the chuck table and the information regarding positions of the optical thickness measuring instrument. Consequently, thickness data is acquired. In the thickness data, the positional information regarding the measurement points and the information regarding the measured thicknesses are related to each other. The average value of thicknesses obtained by measuring the thickness of one rectangular area of the wafer at a plurality of measurement points is regarded as the thickness of a chip produced from the rectangular area.

The thickness of the wafer along projected dicing lines may be different from the thickness of a central portion of a rectangular area of the wafer that is surrounded at its four sides by corresponding projected dicing lines. For example, for the purpose of increasing the processing quality of a step of cutting the wafer along the projected dicing lines, an insulating film or the like that would tend to lower the processing quality may not be deposited on the projected dicing lines. As a result, the thickness of the wafer along the projected dicing lines may be smaller than the thickness of the wafer at the central portion of the rectangular area. Therefore, if the thickness of the wafer along the projected dicing lines is incorporated in thickness data for calculating the thicknesses of chips, then the thicknesses of chips that are calculated on the basis of the thickness data may be different from the actual thicknesses of chips to be calculated.

SUMMARY OF THE INVENTION

It is therefore an object of the present invention to provide a measuring method and a measuring apparatus for measuring the thickness of each of chips to be fabricated from a wafer while minimizing the effect of the thickness of an outer peripheral portion of each of the chips.

In accordance with an aspect of the present invention, there is provided a measuring method for measuring thicknesses of a plurality of chips. The chips are produced by dividing a wafer along dividing grooves formed in and along a plurality of projected dicing lines on a face side of the wafer. The projected dicing lines each have a predetermined width and demarcate a plurality of areas in a grid form on the face side with devices constructed in the respective areas. The measuring method includes a holding step of holding face sides of the chips on a holding surface of a holding table with a protective member interposed therebetween, a first storing step of storing thickness data of each of the chips held on the holding surface, the thickness data being obtained by measurement of thicknesses of portions of the chip at a plurality of measurement points and representing the thicknesses measured at the measurement points in association with positions of the measurement points in a predetermined plane corresponding to a reverse side of the wafer, a second storing step of storing positions of central lines of the respective dividing grooves in the predetermined plane in captured images of reverse sides of the chips held on the holding surface, a setting step of setting, in a periphery of each of the chips, a thickness data unreferencing zone including measurement points that are positioned within predetermined distances from the positions of the central lines of corresponding ones of the dividing grooves and where the thickness data will not be referenced in calculating a thickness of the chip, on the basis of the thickness data of the chip, and a calculating step of calculating, for each of the chips, an average value of thicknesses at the measurement points except for the measurement points included in the thickness data unreferencing zone.

In accordance with another aspect of the present invention, there is provided a measuring apparatus for measuring thicknesses of a plurality of chips. The chips are produced by dividing a wafer along dividing grooves formed in and along a plurality of projected dicing lines on a face side of the wafer. The projected dicing lines each have a predetermined width and demarcate a plurality of areas in a grid form on the face side with devices constructed in the respective areas. The measuring apparatus includes a holding table having a holding surface for holding thereon face sides of the chips with a protective member interposed therebetween, a thickness measuring unit for measuring, at a plurality of measurement points, thicknesses of portions of each of the chips held on the holding surface, an image capturing unit for capturing images of reverse sides of the chips held on the holding surface, a moving unit for moving the thickness measuring unit and the image capturing unit relatively to the holding table, and a controller having a processor and configured to control at least the holding table, the thickness measuring unit, the image capturing unit, and the moving unit. The controller includes a storage section for storing thickness data of each of the chips, the thickness data representing the thicknesses measured at the measurement points in association with positions of the measurement points in a predetermined plane corresponding to a reverse side of the wafer, and positions of central lines of the respective dividing grooves in the predetermined plane in the images captured by the image capturing unit, a setting section for setting, in a periphery of each of the chips, a thickness data unreferencing zone including measurement points that are positioned within predetermined distances from the positions of the central lines of corresponding ones of the dividing grooves and where the thickness data will not be referenced in calculating a thickness of the chip, on the basis of the thickness data, and a calculating section for calculating, for each of the chips, an average value of thicknesses at the measurement points except for the measurement points included in the thickness data unreferencing zone.

With the measuring method according to the aspect of the invention and the measuring apparatus according to the other aspect of the invention, the thickness data unreferencing zone including measurement points that are positioned within predetermined distances from the positions of the central lines of corresponding ones of the dividing grooves and where the thickness data will not be referenced in calculating the thickness of the chip is set in a periphery of each of the chips. Then, an average value of thicknesses at the measurement points except for the measurement points included in the thickness data unreferencing zone is calculated as the thickness of the chip. The thickness of each chip can thus be calculated without involving the thicknesses in the vicinity of the projected dicing lines. Therefore, the effect that the thicknesses of outer peripheral portions of the chips have is reduced, allowing the thickness of each chip to be calculated more accurately.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
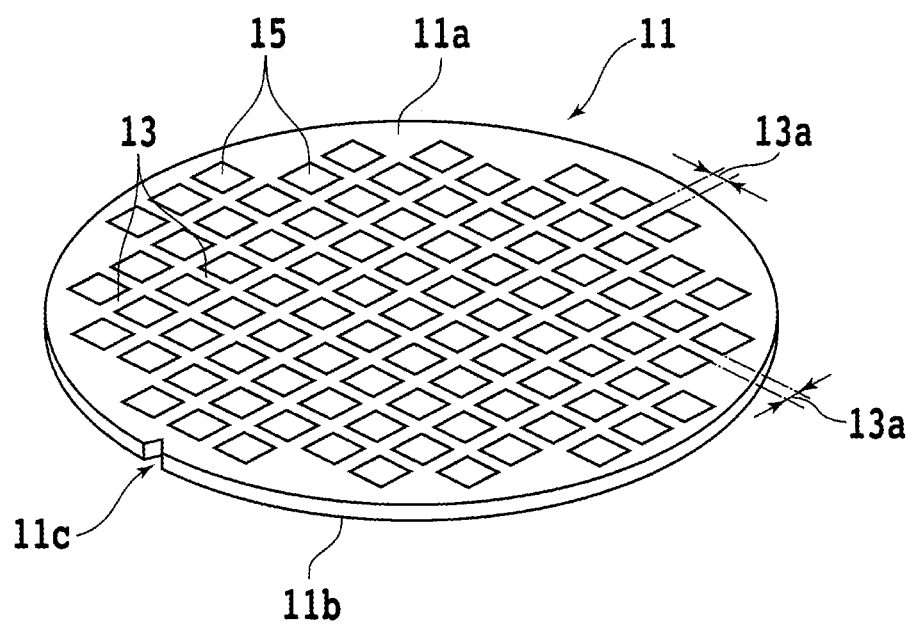
FIG. 1 is a schematic perspective view of a wafer.

A preferred embodiment of the present invention will be described hereinbelow with reference to the accompanying drawings. First, a wafer 11 (see FIG. 1) to be divided into a plurality of chips 21 (see FIG. 2A) will be described below. FIG. 1 schematically illustrates the wafer 11 in perspective. As illustrated in FIG. 1, the wafer 11 is shaped as a circular plate and has a monocrystalline substrate made of a semiconductor material such as silicon. However, the wafer 11 is not limited to having a monocrystalline substrate made of a semiconductor material such as silicon, and may have a monocrystalline substrate made of a compound semiconductor such as silicon carbide (SiC) or gallium nitride (GaN).

The wafer 11 has a circular face side 11a and a circular reverse side 11b. The wafer 11 also has a notch or recess 11c defined in an outer circumferential edge thereof as representing the crystal orientation of the wafer 11. The wafer 11 may alternatively have an orientation flat instead of the notch 11c. A grid of projected dicing lines 13 each having a predetermined width 13a is established on the face side 11a.

For example, providing the wafer 11 has a diameter of 300 mm, i.e., 12 inches, for example, each of the projected dicing lines 13 on the face side 11a may have a width 13a of 0.1 mm. These projected dicing lines 13 demarcate 968 rectangular areas, each having four sides that are 8 mm long, on the face side 11a. Alternatively, each of the projected dicing lines 13 on the face side 11a may have a width 13a of 0.07 mm. These projected dicing lines 13 demarcate 58,788 rectangular areas, each having four sides that are 1 mm long, on the face side 11a.

Devices 15 such as ICs or light emitting diodes (LEDs) are constructed in the respective rectangular areas demarcated by the projected dicing lines 13. The wafer 11 is not limited to any particular sizes, and the devices 15 are not limited to any particular kinds, numbers, shapes, structures, sizes, layouts, etc. The wafer 11 includes an annular region of predetermined width, i.e., outer circumferential excess region, between the outer circumferential edge of the wafer 11 and a radially inner circle spaced radially inwardly from the outer circumferential edge by a predetermined distance of 3 mm, for example. The annular region is free of any devices 15.

The wafer 11 is divided into a plurality of chips 21 along dividing grooves 13b (see FIG. 2A) that are produced in and along the respective projected dicing lines 13 by a processing step such as a dicing before grinding (DBG) step or a stealth dicing before grinding (SDBG) step. According to the DBG step, grooves which are known as half-cut grooves are produced in the projected dicing lines 13 on the face side 11a of the wafer 11. The grooves are defined in the face side 11a, but terminate short of the reverse side 11b. Then, the reverse side 11b is ground until the grooves are exposed thereon, thereby dividing the wafer 11 into the chips 21. According to the SDBG step, modified layers, not illustrated, are produced in the wafer 11 along the projected dicing lines 13 at a predetermined depth in the wafer 11. Then, the reverse side 11b is ground to cause cracks to develop from the modified layers in directions from the face side 11a toward the reverse side 11b, thereby dividing the wafer 11 into the chips 21.

When the reverse side 11b of the wafer 11 is thus ground to divide the wafer 11 into the chips 21, a resin-made tape 17 (see FIG. 2A) has been affixed as a protective member to the face side 11a. After the wafer 11 has been divided, therefore, the chips 21 are held integrally together by the tape 17 as a chip unit 23, as illustrated in FIG. 2A.

Figure 2A:
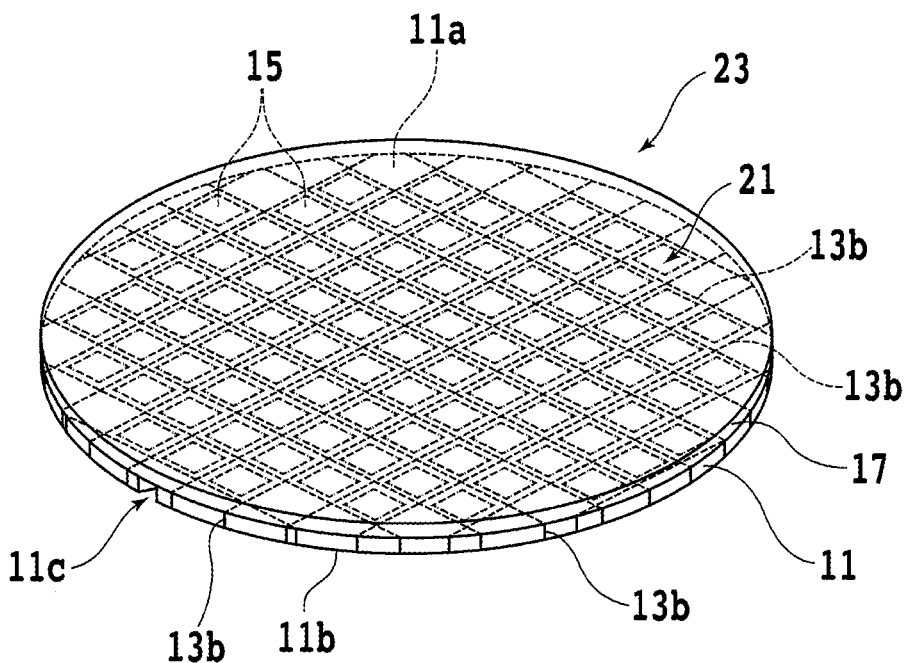
FIG. 2A is a perspective view of a chip unit.
Figure 2B:
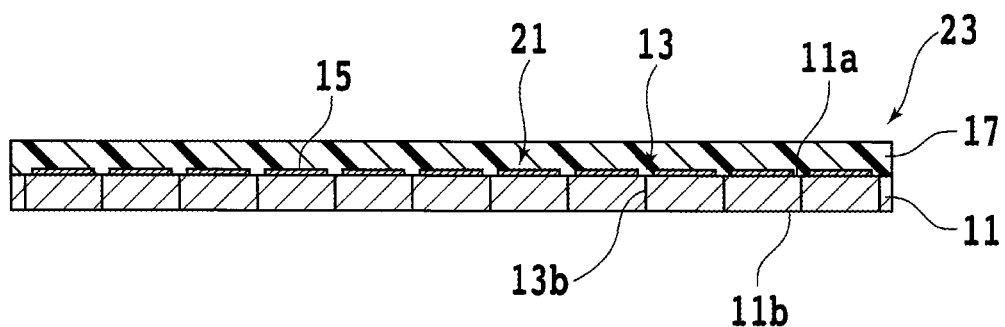
FIG. 2B is a cross-sectional view of the chip unit.

FIG. 2A illustrates the chip unit 23 in perspective, and FIG. 2B illustrates the chip unit 23 in cross section. As illustrated in FIGS. 2A and 2B, the face side 11a of the wafer 11 becomes face sides 11a of the chips 21, and the reverse side 11b of the wafer 11 becomes reverse sides 11b of the chips 21. The chips 21 of the chip unit 23 have respective thicknesses measured by a measuring apparatus 2 (see FIG. 3) according to a measuring method (see FIG. 4) to be described later. First, the measuring apparatus 2 will be described below.

Figure 3:
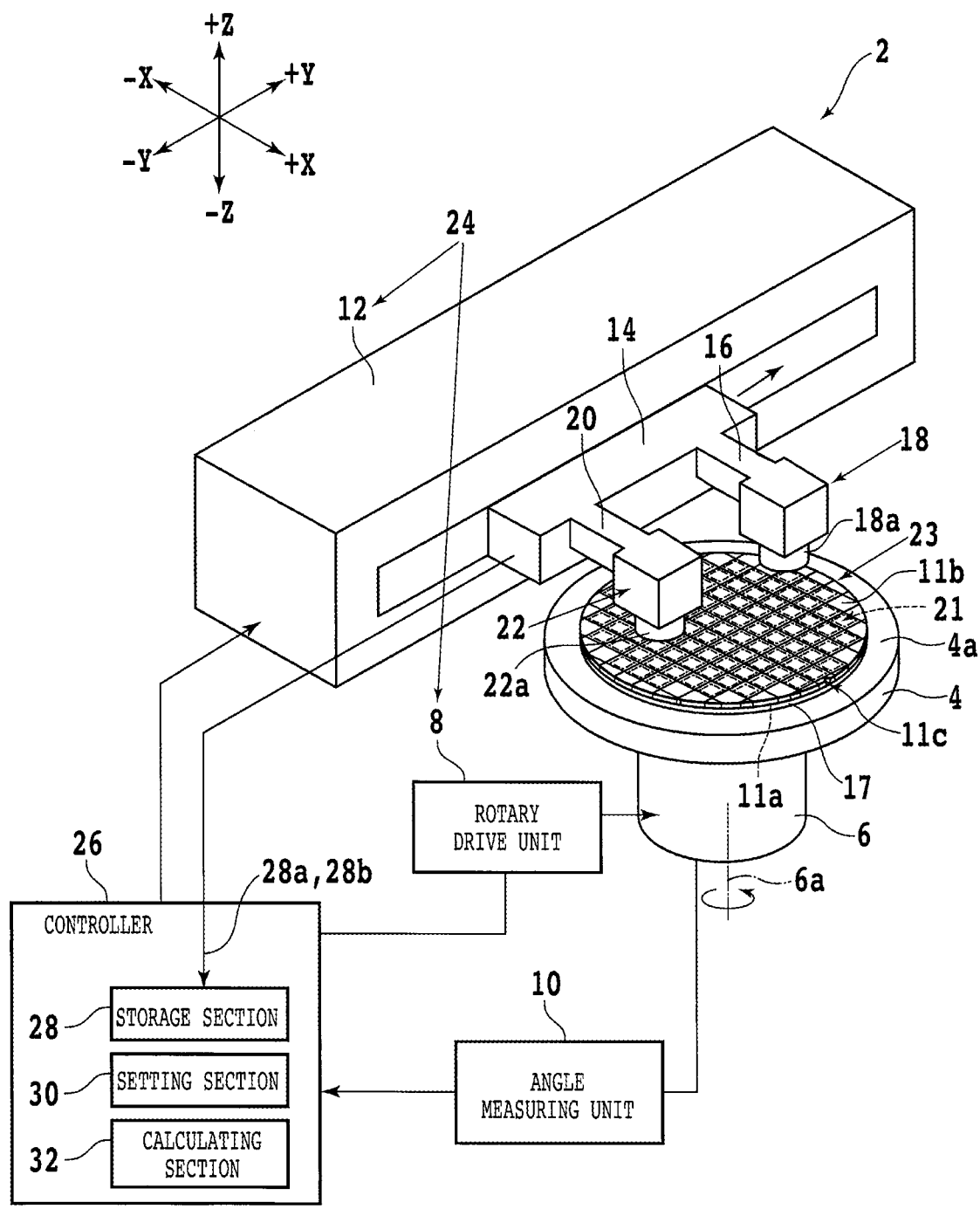
FIG. 3 is a perspective view of a measuring apparatus according to an embodiment of the present invention.

FIG. 3 illustrates the measuring apparatus 2 in perspective. In FIG. 3, some of the components of the measuring apparatus 2 are illustrated in block form for illustrative purposes. In FIG. 3, the measuring apparatus 2 is illustrated with respect to an XYZ coordinate system having an X-axis, a Y-axis, and a Z-axis that extend perpendicularly to each other. FIG. 3 illustrates a +X direction and a −X direction that extend in opposite directions and that are parallel to the X-axis, and a +Y direction and a −Y direction that extend in opposite directions and that are parallel to the Y-axis. FIG. 3 further illustrates a +Z direction and a −Z direction that extend in opposite directions and that are parallel to the Z-axis. The +Z direction may also be referred to as an upward direction and the −Z direction as a downward direction.

Figure 5:
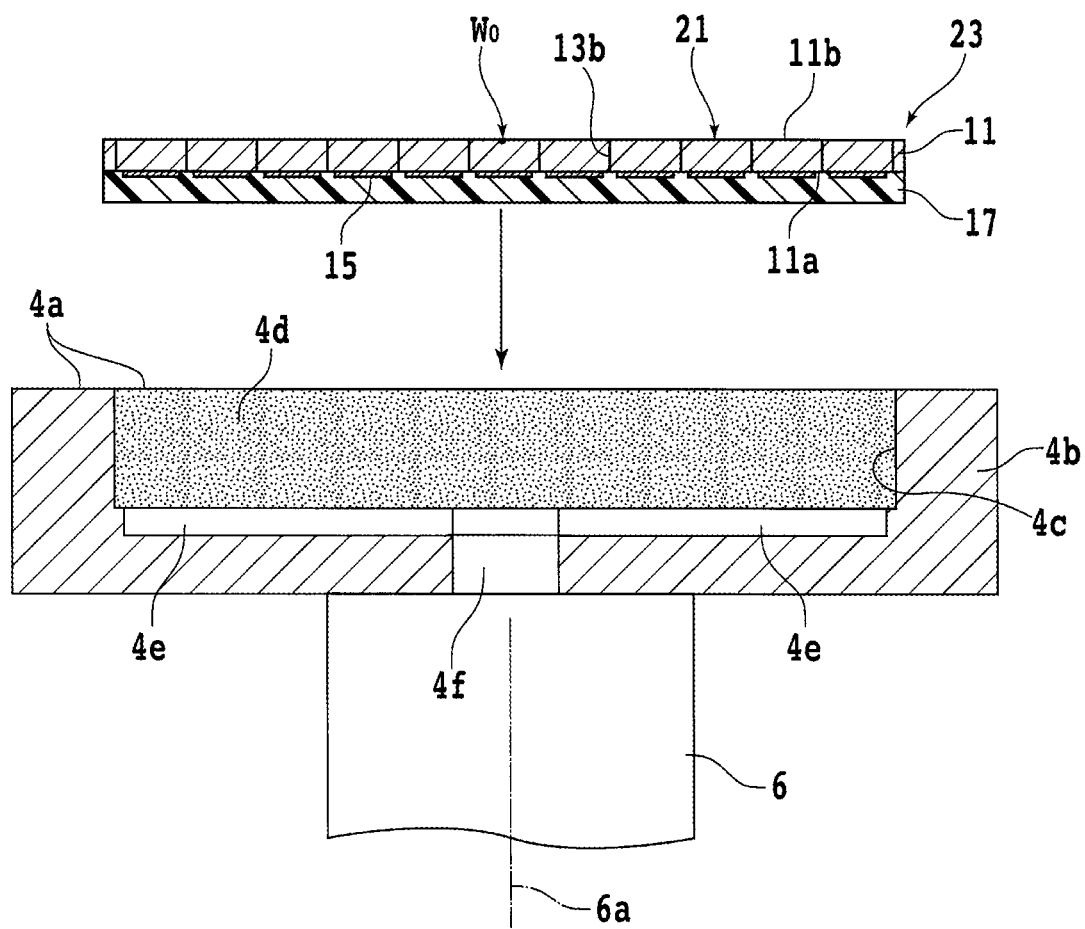
FIG. 5 is a cross-sectional view illustrating a holding step of the measuring method.

The measuring apparatus 2 has a chuck table or holding table 4 shaped as a circular plate. As illustrated in FIG. 5, the chuck table 4 has a circular frame 4b made of non-porous ceramic. The circular frame 4b has a circular cavity 4c defined therein. The circular cavity 4c is upwardly recessed and open at an upper surface of the frame 4b. The cavity 4c houses therein a circular porous plate 4d made of porous ceramic. The frame 4b has a bottom plate disposed beneath the porous plate 4d and having slots 4e and a hole 4f defined therein. The slots 4e and the hole 4f are fluidly connected to a suction source, not illustrated, such as a vacuum pump or an ejector and transmit a negative pressure from the suction source to the porous plate 4d. When the negative pressure from the suction source is transmitted through the slots 4e and the hole 4f and acts on the porous plate 4d, the negative pressure is transmitted through the porous plate 4d and acts on an upper surface thereof.

The frame 4b has an upper surface lying flush with the upper surface of the porous plate 4d. The upper surface of the frame 4b and the upper surface of the porous plate 4d jointly function as and provide a holding surface 4a for holding the chip unit 23, i.e., the chips 21, under suction thereon by the negative pressure transmitted from the suction source. The chips 21 are held under suction on the holding surface 4a such that their face sides 11a are placed on the holding surface 4a with the tape 17 interposed therebetween and their reverse sides 11b are exposed upwardly.

As illustrated in FIG. 3, the chuck table 4 has a lower portion coupled to a cylindrical post 6 with a driven pulley, not illustrated, mounted concentrically thereon. The post 6 is disposed near a rotary drive unit 8 including a drive pulley, an electric motor, an endless belt, etc., all not illustrated. The endless belt is trained around the driven pulley and the drive pulley. When the rotary drive unit 8 is energized, it generates and transmits rotary power through the endless belt to the post 6, rotating the chuck table 4 about a rotational axis 6a aligned with a central axis of the post 6 that extends along the Z-axis. The chuck table 4 is rotatable clockwise and counterclockwise, as viewed in plan, about the rotational axis 6a in an unlimited range of rotational angles.

The post 6 has a lower portion connected to an angle measuring unit 10 called a rotary encoder. According to the present embodiment, the angle measuring unit 10 includes a scale, not illustrated, shaped as a circular plate and an optical reader, not illustrated, for reading graduations on a lower surface of the scale. The scale is fixed concentrically to the post 6. The graduations of the scale are spaced at equal angular intervals along circumferential directions of the scale. The optical reader is disposed below the scale and includes a light emitter such as an LED for applying measuring light to the scale.

The reader further includes a light detector such as a photosensor for detecting light reflected by the graduations of the scale from the measuring light applied to the scale. The reader has a predetermined electric circuit for performing signal processing on a signal produced by the light detector. Specifically, the electric circuit counts pulses of the reflected light detected by the light detector, generates an electric signal representing the count as information regarding the angle through which the chuck table 4 has rotated, and sends the generated signal to a controller 26 to be described later. The controller 26 can grasp the angle through which the chuck table 4 has rotated, on the basis of the received electric signal. According to the present invention, the angle measuring unit 10 is not limited to the reflective optical system described above, and may be a transmissive optical system, a magnetic measuring system, or an electromagnetic inductive measuring system as long as the information regarding the angle through which the chuck table 4 has rotated can be obtained.

The measuring apparatus 2 includes a ball-screw-type Y-axis moving unit 12 above the chuck table 4. The Y-axis moving unit 12 moves a movable block 14 along the Y-axis. The movable block 14 is slidably mounted on a pair of guide rails, not illustrated, that extend along the Y-axis and that are disposed in facing relation to a side of the movable block 14 facing in the −X direction. The side of the movable block 14 facing in the −X direction supports thereon a nut, not illustrated, that is operatively threaded over a ball screw, not illustrated, extending along the Y-axis and disposed between the guide rails.

A rotary actuator, not illustrated, such as a stepping motor is coupled to an end of the ball screw along the Y-axis. When the rotary actuator is energized, it rotates the ball screw about its longitudinal axis, causing the nut to move the movable block 14 along the Y-axis. In FIG. 3, the movable block 14 is illustrated as moving in the +Y direction. The movable block 14 has two arms, i.e., a first arm 16 and a second arm 20, that protrude from a side of the movable block 14 facing in the +X direction and that are spaced from each other along the Y-axis. The first arm 16 supports a thickness measuring unit 18 on its distal end. The thickness measuring unit 18 is a reflective spectroscopic thickness gage incorporating a microscope, which is also simply referred to as a thickness gage, and is capable of measuring the thickness of a minute region, i.e., a measurement point $P_A$ illustrated in FIG. 6, on a chip 21 by way of optical interferometry.

Figure 6:
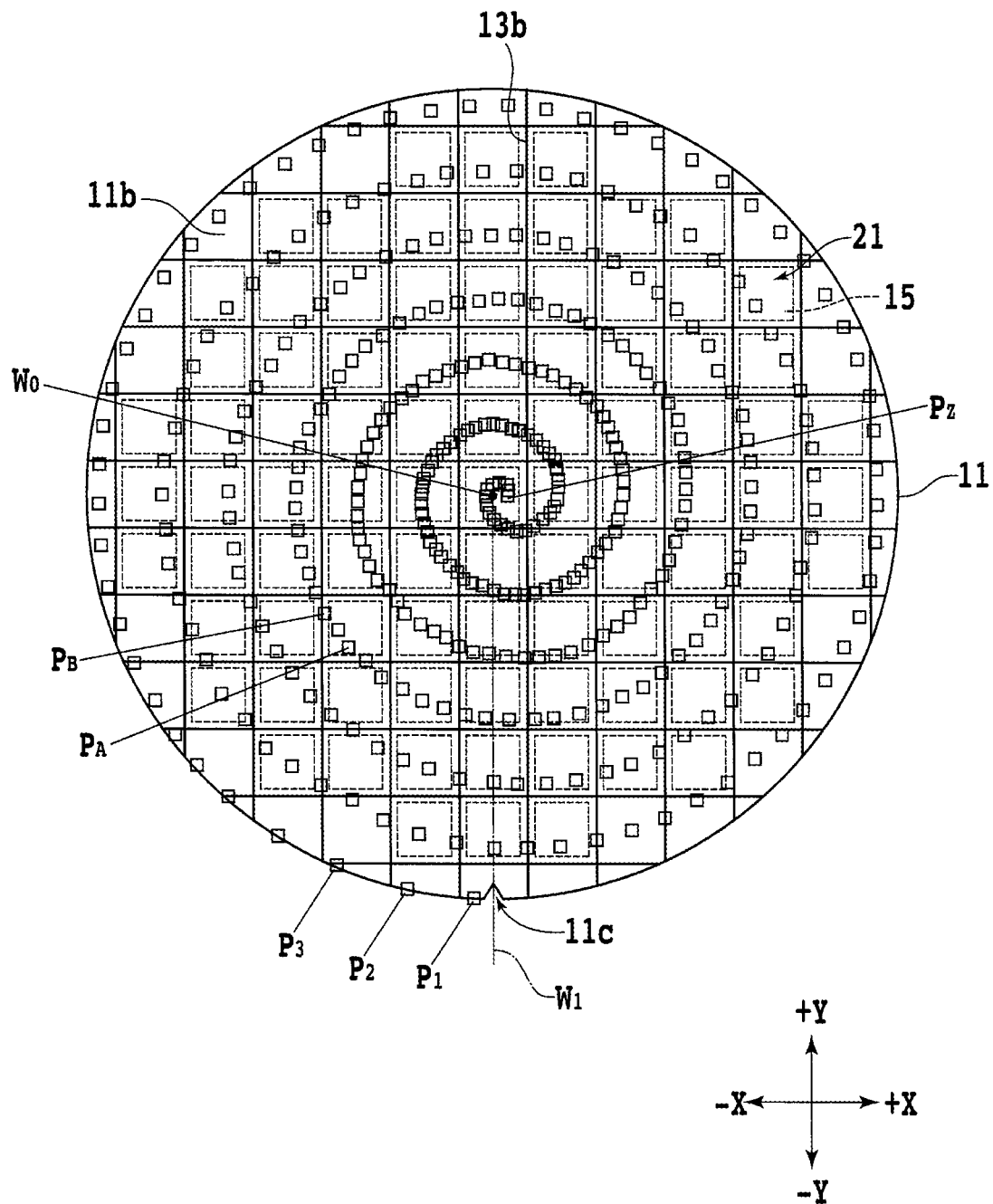
FIG. 6 is a plan view schematically illustrating a plurality of measurement points on the wafer that are to be stored in a first storing step of the measuring method.

According to the present embodiment, a reference character "$P_A$" illustrated in FIG. 6 is used for illustrative purposes to indicate any of a plurality of measurement points on each of the chips 21, and should not be interpreted as representing a specific measurement point. As described later, one or more of a plurality of measurement points $P_A$ that are not used in the calculation of an average value of thicknesses are referred to as "measurement points $P_B$" for the sake of convenience.

The thickness measuring unit 18 includes a head 18a disposed in facing relation to the holding surface 4a of the chuck table 4 along the Z-axis. The head 18a includes a condensing lens, not illustrated, whose optical axis is oriented along the Z-axis. The head 18a also includes a light source such as an LED for emitting a measurement light beam, e.g., an infrared radiation beam, in a predetermined band transmittable through the chips 21. The head 18a applies the measurement light beam successively to the chips 21 held under suction on the holding surface 4a while focusing the measurement light beam in the vicinity of the reverse sides 11b of the chips 21 with the condensing lens.

The head 18a receives a light beam reflected by the reverse sides 11b of the chips 21 from the applied measurement light beam and also detects a light beam reflected by the face sides 11a of the chips 21 from the applied measurement light beam. An interference light beam produced from the respective light beams reflected by the reverse sides 11b and the face sides 11a is detected by an optical detecting device, not illustrated, such as a photosensor included in the thickness measuring unit 18. The spectrum of the interference light beam varies depending on the difference between the optical paths of the reflected light beams. The thicknesses of the chips 21 at the measurement points $P_A$ are measured on the basis of the spectrum of the interference light beam.

The second arm 20 supports an image capturing unit 22 on its distal end. The image capturing unit 22 is an optical microscope and captures an image of the reverse sides 11b of the chips 21, thereby acquiring an image including dividing grooves 13b produced in and along the respective projected dicing lines 13. The image capturing unit 22 includes a head 22a disposed in facing relation to the holding surface 4a of the chuck table 4 along the Z-axis. The head 22a includes a condensing lens, not illustrated, whose optical axis is oriented along the Z-axis.

The head 22a also includes a light source such as an LED for emitting a measurement light beam, e.g., a white light beam. The head 22a applies the measurement light beam successively to the chips 21 held under suction on the holding surface 4a while focusing the measurement light beam in the vicinity of the reverse sides 11b of the chips 21 with the condensing lens. The measurement light beam applied to the chips 21 is reflected by the reverse side 11b and is then guided through the condensing lens to a line sensor, i.e., an image capturing device, not illustrated, in the image capturing unit 22. The line sensor is also referred to as a linear image sensor or the like, and has a linear array of photodiodes, phototransistors, or the like. The line sensor forms a charge-coupled device (CCD) image sensor or a complementary metal-oxide-semiconductor (CMOS) image sensor.

The heads 18a and 22a are spaced from each other by a distance that is large enough not to adversely affect each other's measurement. For example, the optical axes of the condensing lenses of the heads 18a and 22a are spaced from each other by a distance equal to or larger than the radius of the wafer 11. A partition plate, not illustrated, whose surfaces have been treated by a predetermined surface treatment step or have been coated with light absorption films may be disposed between the heads 18a and 22a in order to prevent the measurement light beam from the head 18a and the measurement light beam from the head 22a from interfering with each other.

The rotary drive unit 8 and the Y-axis moving unit 12 function as a moving unit 24 for moving the thickness measuring unit 18 and the image capturing unit 22 relatively to the chuck table 4. According to the present embodiment, the movable block 14 is moved in the +Y direction, and at the same time, the chuck table 4 is rotated counterclockwise as viewed in plan about the rotational axis 6a while the spots of the measurement light beams applied from the thickness measuring unit 18 and the image capturing unit 22 are positioned in the vicinity of the reverse sides 11b of the chips 21 along the Z-axis. In this manner, the thicknesses of the respective chips 21 are measured at the measurement points $P_A$, and an overall image of the reverse sides 11b of the chips 21 is acquired.

The operation of the chuck table 4, the angle measuring unit 10, the thickness measuring unit 18, the image capturing unit 22, and the moving unit 24 is controlled by the controller 26. According to the present embodiment, the controller 26 is formed by a computer that has a processor, i.e., a processing device, typified by a central processing unit (CPU), and a memory, i.e., a storage device, including a main storage unit and an auxiliary storage unit. The main storage unit includes a dynamic random access memory (DRAM), a static random access memory (SRAM), a read only memory (ROM), or the like. The auxiliary storage unit includes a flash memory, a hard disk drive, a solid state drive, or the like.

The auxiliary storage unit stores software including predetermined programs. The controller 26 has its functions performed by operating the processing device, etc., according to the programs stored in the auxiliary storage unit. The auxiliary storage unit includes a portion, i.e., a storage space, that functions as a storage section 28 for storing predetermined information obtained by the measurement performed by the thickness measuring unit 18 and the image capturing unit 22. Specifically, the storage section 28 stores thickness data 28a in which the positions, i.e., the coordinates, of the measurement points $P_A$ in a predetermined plane, e.g., a plane corresponding to the reverse side 11b of the wafer 11 that has been divided or that is yet to be divided, with the notch 11c used as a reference, and the thicknesses at the measurement points $P_A$ are related to each other.

At the start of the thickness measurement, the positions of the movable block 14 and the chuck table 4 are adjusted to position the spot of the measurement light beam applied from the head 18a at the notch 11c. Therefore, the positions of the respective measurement points $P_A$ are automatically calculated by the controller 26 on the basis of the initial position of the spot of the measurement light beam, the rotational speed of the chuck table 4, and the speed at which the movable block 14 moves. According to the present embodiment, the rotational speed of the chuck table 4 is 300 degrees/s, and the speed at which the movable block 14 moves is 9,308 µm/s, so that the measurement spots $P_A$ are arranged in a spiral pattern on the reverse side 11b of the wafer 11 (see FIG. 6).

The head 22a of the image capturing unit 22 is spaced from the head 18a of the thickness measuring unit 18 by a predetermined distance in the −Y direction that is opposite the +Y direction in which the movable block 14 travels as illustrated in FIG. 3. Therefore, the image capturing unit 22 starts capturing an image of the reverse side 11b of the wafer 11 after a predetermined period of time which is calculated by dividing the predetermined distance referred to above by the speed at which the movable block 14 moves has elapsed since the start of the movement of the movable block 14 in the +Y direction.

The storage section 28 also stores image data 28b from the image capturing unit 22. Pieces of the image data 28b are processed by a first program, among the programs stored in the auxiliary storage unit, that is executed by the processing device, and are synthesized into a single image having an image capturing range of a predetermined size, e.g., a square size having four sides each approximately 335 mm long.

Then, the synthesized image is processed by a second program, among the programs stored in the auxiliary storage unit, that is executed by the processing device, to specify the position of a central line $13b_1$ (see FIG. 7) in the width direction of each dividing groove 13b that is perpendicular to the longitudinal direction thereof. Specifically, for example, an image processing step such as edge detection is performed on the synthesized image to specify the coordinates of both widthwise edges of one dividing groove 13b. Then, the intermediate position between the coordinates of both edges is calculated to specify the position of the central line 13b1 in the width direction of the one dividing groove 13b.

The positions of the central lines 13b1 of the dividing grooves 13b are also stored in the storage section 28. According to the present embodiment, the positions of the central lines 13b1 also represent positions, i.e., coordinates, in the predetermined plane, e.g., the plane corresponding to the reverse side 11b of the divided wafer 11, with the notch 11c used as a reference, as is the case with the positions of the respective measurement points $P_A$. For example, with respect to a chip 21 illustrated in FIG. 7, the position (X=c) of a central line 13b1 parallel to the Y-axis and the position (X=d) of another central line $13b_1$ parallel to the Y-axis are stored in the storage section 28. With respect to this chip 21, moreover, the position (Y=e) of a central line 13b1 parallel to the X-axis and the position (Y=f) of another central line 13b1 parallel to the X-axis are stored in the storage section 28.

A third program, among the programs stored in the auxiliary storage unit, is executed by the processing device to function as a setting section 30 (see FIG. 3) for setting a thickness data unreferencing zone Q (see FIG. 10) in an outer circumferential portion, i.e., in the periphery, of each of the chips 21 on the basis of the thickness data 28a of the chip 21. The thickness data unreferencing zone Q includes measurement points $P_B$ that are positioned within a predetermined distance R (see FIG. 9) from the position of the central line $13b_1$ of a dividing groove 13b and where the thickness data 28a is not referenced in the calculation of the thickness of the chip 21.

A fourth program, among the programs stored in the auxiliary storage unit, is executed by the processing device to function as a calculating section 32 for calculating an average value of the thicknesses at the measurement points $P_A$ except for the measurement points $P_B$ included in the thickness data unreferencing zone Q in each of the chips 21.

Figure 4:
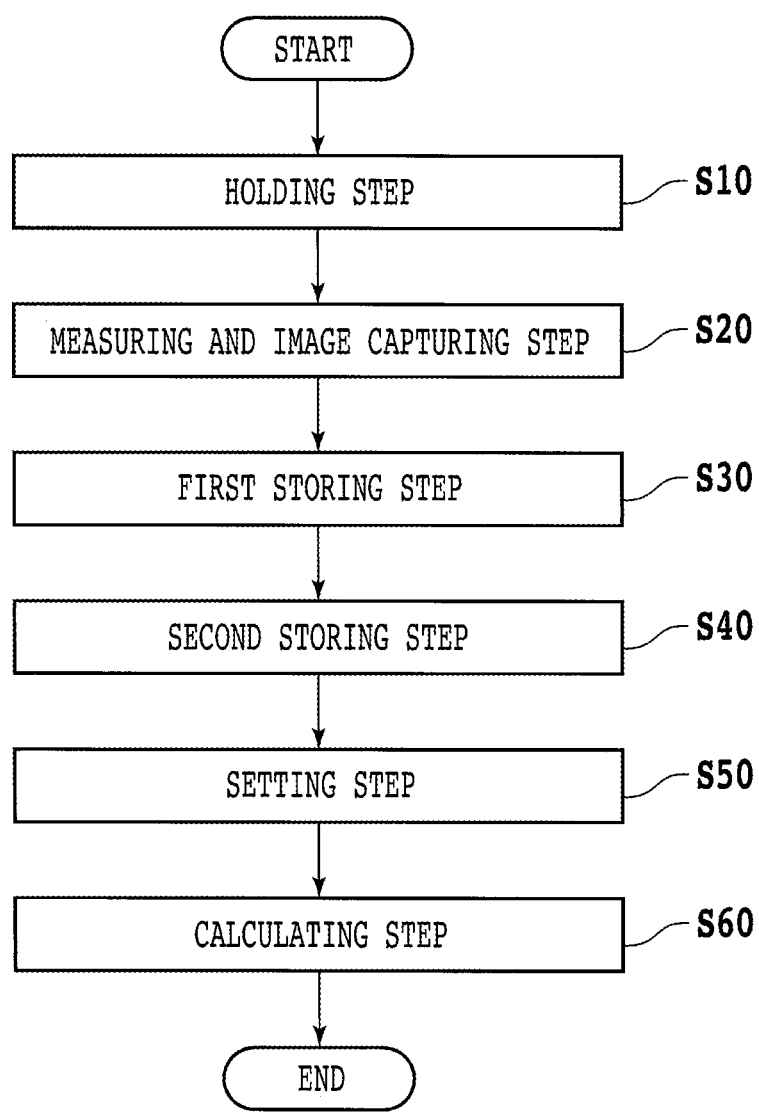
FIG. 4 is a flowchart of a sequence of a measuring method according to the embodiment.

A measuring method for measuring the thicknesses of the chips 21 by using the measuring apparatus 2 will be described below with reference to FIGS. 4 through 10. FIG. 4 is a flowchart of a sequence of the measuring method according to the present embodiment. First, as illustrated in FIG. 5, the face sides 11a of the chips 21 produced by dividing the wafer 11 are held under suction on the holding surface 4a with the tape 17 interposed therebetween (holding step S10). FIG. 5 illustrates holding step S10 in cross section.

In holding step S10, specifically, the chip unit 23 is held under suction on the holding surface 4a while a hypothetical straight line $W_1$ (see FIG. 6) interconnecting a radial central position $W_0$ of the reverse side 11b of the wafer 11 and the notch 11c extends parallel to the Y-axis and the notch 11c is open in the −Y direction.

After holding step S10, the thickness measuring unit 18 measures thicknesses, and the image capturing unit 22 captures images of the dividing grooves 13b from the reverse side 11b of the wafer 11 (measuring and image capturing step S20). In measuring and image capturing step S20, while the spot of the measurement light beam from the head 18a of the thickness measuring unit 18 is positioned at the notch 11c, the chuck table 4 starts rotating in a predetermined direction, and the movable block 14 starts moving in a predetermined direction. According to the present embodiment, specifically, the chuck table 4 rotates clockwise as viewed in plan about the rotational axis 6a, and the movable block 14 moves in the +Y direction, as illustrated in FIG. 6. In measuring and image capturing step S20, the thickness measuring unit 18 produces the thickness data 28a, and the image capturing unit 22 produces the image data 28b.

After measuring and image capturing step S20, the storage section 28 stores the thickness data 28a (first storing step S30). FIG. 6 schematically illustrates, in plan, a plurality of measurement points $P_A$ on the wafer 11 that are to be stored in first storing step S30. According to the present embodiment, the number of the measurement points $P_A$ is approximately 800,000. In FIG. 6, much less measurement points $P_A$ than 800,000 are illustrated for better visibility.

In the thickness measurement, the thickness of the wafer 11 is measured successively at measuring points $P_1$, $P_2$, $P_3$, . . . , and Pz (z represents a natural number of 3 or larger and is approximately 800,000 according to the present embodiment). If the wafer 11 has 968 rectangular areas where the devices 15 are present, then the number of measurement points $P_A$ per chip 21 is approximately 826 on average. If the wafer 11 has 58,788 rectangular areas where the devices 15 are present, then the number of measurement points $P_A$ per chip 21 is approximately 14 on average.

Figure 7:
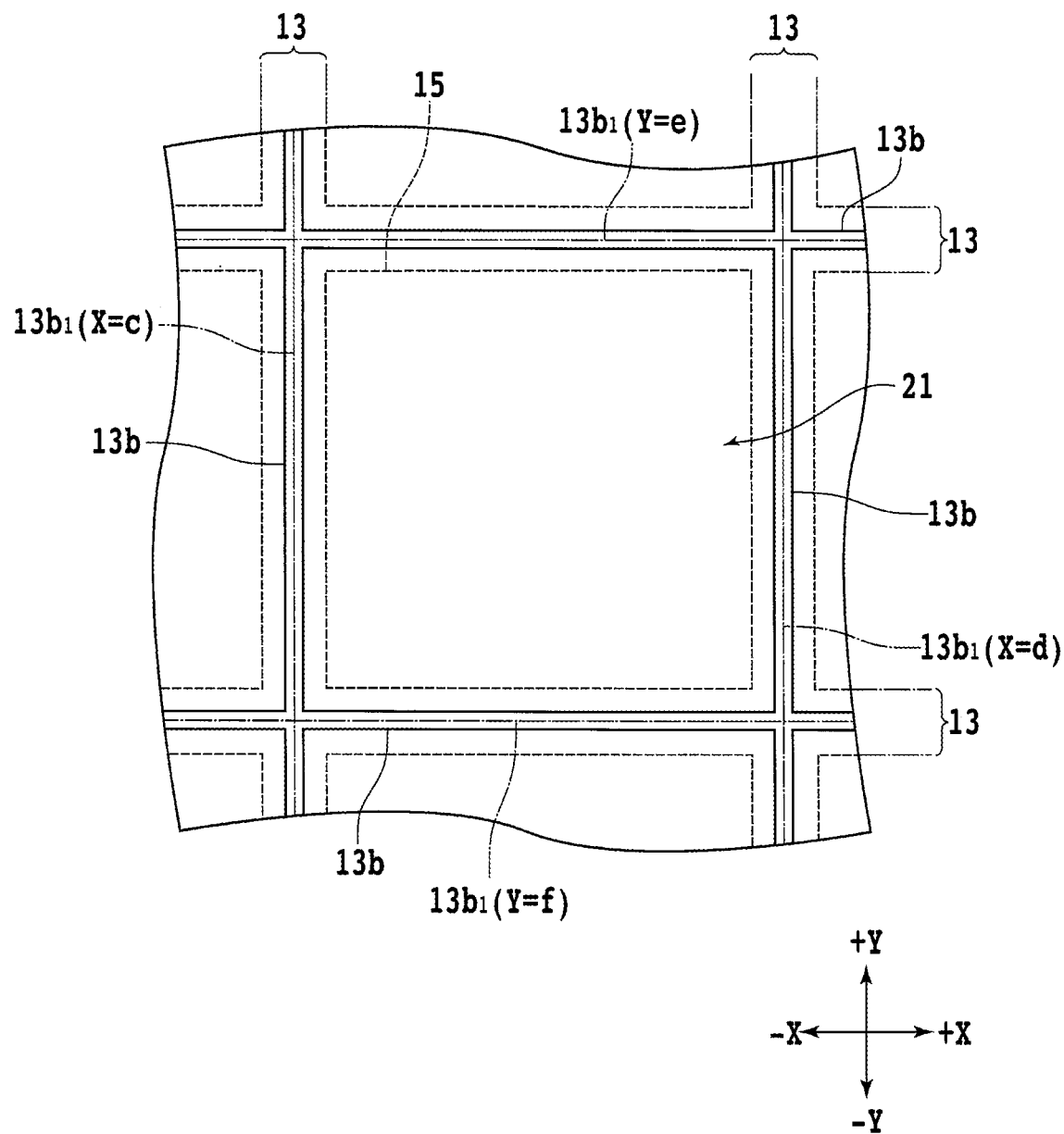
FIG. 7 is an enlarged fragmentary plan view schematically illustrating central lines of a plurality of dividing grooves in the wafer that are to be stored in a second storing step of the measuring method.

As described above, the positions of the respective measurement points $P_A$ are defined in the predetermined plane, e.g., the plane corresponding to the reverse side 11b of the wafer 11 that has been divided or that is yet to be divided, with the notch 11c used as a reference. After measuring and image capturing step S20, the storage section 28 stores the positions of the central lines 13b1 of the dividing grooves 13b that have been obtained by processing the image data 28b (second storing step S40). First storing step S30 and second storing step S40 may be performed in random order or may be performed simultaneously. FIG. 7 schematically illustrates, in enlarged fragmentary plan, the central lines 13b1 of a plurality of dividing grooves 13b around one chip 21 that are to be stored in second storing step S40. In FIG. 7, the measurement points $P_A$ are omitted from illustration. As described above, the positions of the central lines 13b1 are also defined in the predetermined plane, e.g., the plane corresponding to the reverse side 11b of the wafer 11 that has been divided or that is yet to be divided, with the notch 11c used as a reference.

Figure 8:
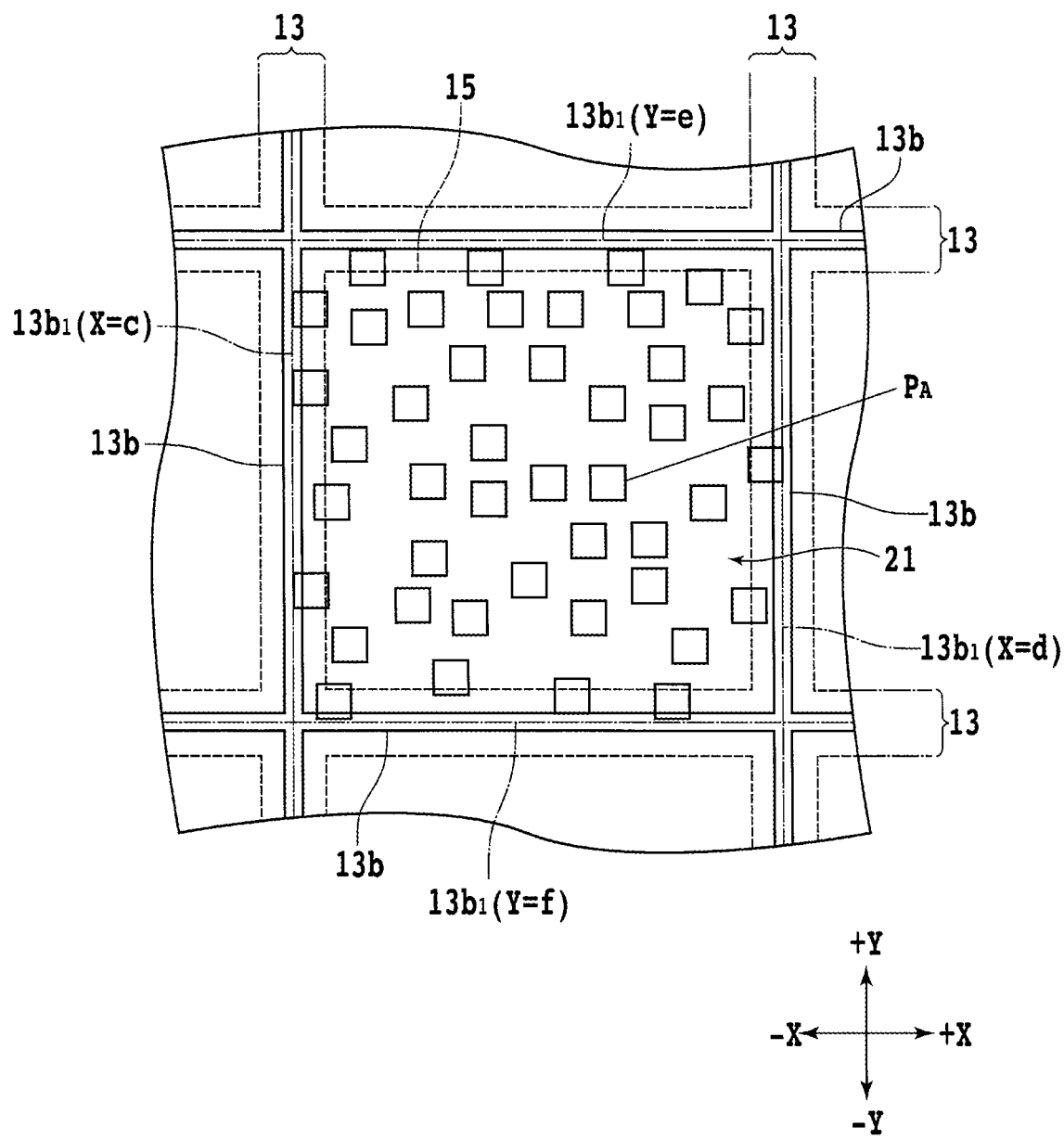
FIG. 8 is an enlarged fragmentary plan view schematically illustrating a plurality of measurement points on a chip and the central lines of a plurality of dividing grooves around the chip.
Figure 9:
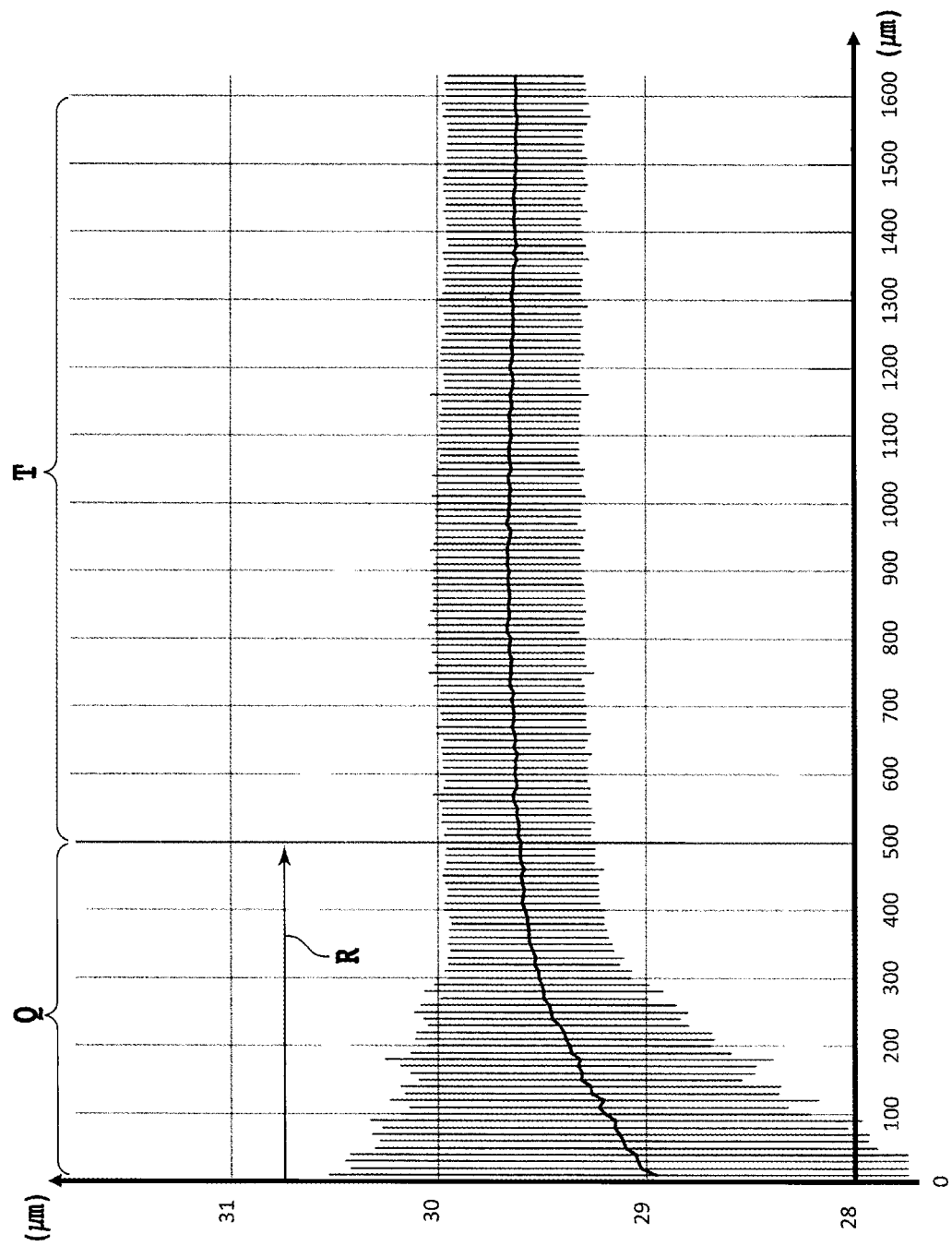
FIG. 9 is a graph illustrating a thickness data unreferencing zone set in a setting step of the measuring method.

After first storing step S30 and second storing step S40, the setting section 30 sets a thickness data unreferencing zone Q in the periphery of each chip 21 on the basis of the thickness data 28a of the chip 21 (setting step S50). FIG. 8 schematically illustrates, in enlarged fragmentary plan, a plurality of measurement points $P_A$ on a chip 21 and the central lines 13b1 (X=c), (X=d), (Y=e), and (Y=f) of a plurality of dividing grooves 13b around the chip 21. FIG. 9 is a graph illustrating the thickness data unreferencing zone Q, etc., set in setting step S50. In FIG. 9, the horizontal axis represents distances (μm) from the central line 13b1 (X=c) positioned adjacent to the chip 21 in the −X direction, to the respective measurement points $P_A$ positioned on the chip 21. The point zero, i.e., origin, of the horizontal axis corresponds to the position of the central line 13b1 (X=c). In FIG. 9, the vertical axis represents the thicknesses (μm) of the chip 21 at the respective measurement points $P_A$.

In FIG. 9, an average value of the thicknesses at the measurement points $P_A$ and a standard deviation are calculated in each of a plurality of unit regions separated at 10 μm intervals from one central line $13b_1$. A polygonal line graph in FIG. 9 is plotted by interconnecting the average values in the unit regions. Parallel bars extending vertically in FIG. 9 schematically indicate standard deviations of the thicknesses at the measurement points $P_A$ in the unit regions, with (average value+σ) being indicated by the upper ends of the bars and (average value−σ) being indicated by the lower ends of the bars.

For writing the graph illustrated in FIG. 9, the thickness data 28a representing the thicknesses at the measurement points $P_A$ positioned in a range surrounded by the four central lines 13b1 (X=c), (X=d), (Y=e), and (Y=f) is extracted. Then, abnormal thickness values are removed by known processing such as the M-estimator from the data including the distances from the central line 13b1 (X=c) to the respective measurement points $P_A$ and the thicknesses at the respective measurement points $P_A$. In this manner, a robust data analysis can be performed.

As illustrated in FIG. 9, the thicknesses at the measurement points $P_A$ have relatively large variations in the vicinity of the distance of 0 μm, i.e., the central line $13b_1$. The variations in the thicknesses in the vicinity of the central line 13b1 are considered as reflecting the thicknesses at the projected dicing lines 13 where no insulating film occurs. By contrast, as the distance from the central line 13b1 increases, the average values become essentially constant, and the magnitudes of the standard deviations, i.e., the lengths of the bars, become smaller. These changes in the average values and the standard deviations indicate that the thicknesses of the chips 21 become more constant toward the centers of the reverse sides 11b of the chips 21.

According to the present embodiment, a standard deviation and a moving average of average values of thicknesses, i.e., the difference between average values in adjacent unit regions, are determined according to predetermined determining conditions for each of the unit regions in an order closer to the central line $13b_1$. According to the present embodiment, the predetermined determining conditions are that the standard deviation is equal to or smaller than 0.5 μm and that the moving average of average values of thicknesses is equal to or smaller than 0.1 μm.

The setting section 30 sets the distance from the central line 13b1 to the first unit region that has satisfied the predetermined determining conditions, as a distance R. The setting section 30 also sets a region farther than the distance R from the central line 13b1, as an effective zone T (see FIGS. 9 and 10) where the measurement points $P_A$ to be used in the calculation of the thicknesses of the chips 21 are present. In other words, the setting section 30 sets the region extending from the central line $13b_1$ over the distance R, as a thickness data unreferencing zone Q where the measurement points $P_B$ not to be used in the calculation of average values of thicknesses are present.

In the example illustrated in FIG. 9, the region from one central line 13b1 to the position of 500 μm is the thickness data unreferencing zone Q as the above determining conditions are not satisfied in that region. On the other hand, the region extending in the +X direction from the position of 500 μm is the effective zone T. The thickness data unreferencing zone Q and the effective zone T with respect to one central line $13b_1$ (X=c) adjacent to one chip 21 in the −X direction have been described with reference to FIGS. 8 and 9.

In setting step S50, however, a distance $R_1$ with respect to the central line $13b_1$ (X=d), a distance $R_2$ with respect to the central line $13b_1$ (Y=e), and a distance $R_3$ with respect to the central line $13b_1$ (Y=f) are further calculated according to the above determining conditions. In this manner, a thickness data unreferencing zone Q is set in a rectangular annular region including a region extending in the +X direction from the central line $13b_1$ (X=c) over the distance R, a region extending in the −X direction from the central line $13b_1$ (X=d) over the distance $R_1$, a region extending in the −Y direction from the central line $13b_1$ (Y=e) over the distance $R_2$, and a region extending in the +Y direction from the central line $13b_1$ (Y=f) over the distance $R_3$.

Then, a region surrounded by the thickness data unreferencing zone Q is set as an effective zone T. In the manner described above, the setting section 30 extracts corresponding thickness data 28a, removes abnormal thickness values, calculates distances R, etc., according to the determining conditions, and sets a thickness data unreferencing zone Q. Moreover, the setting section 30 similarly sets a thickness data unreferencing zone Q, i.e., an effective zone T, for each of the chips 21 on the wafer 11.

Figure 10:
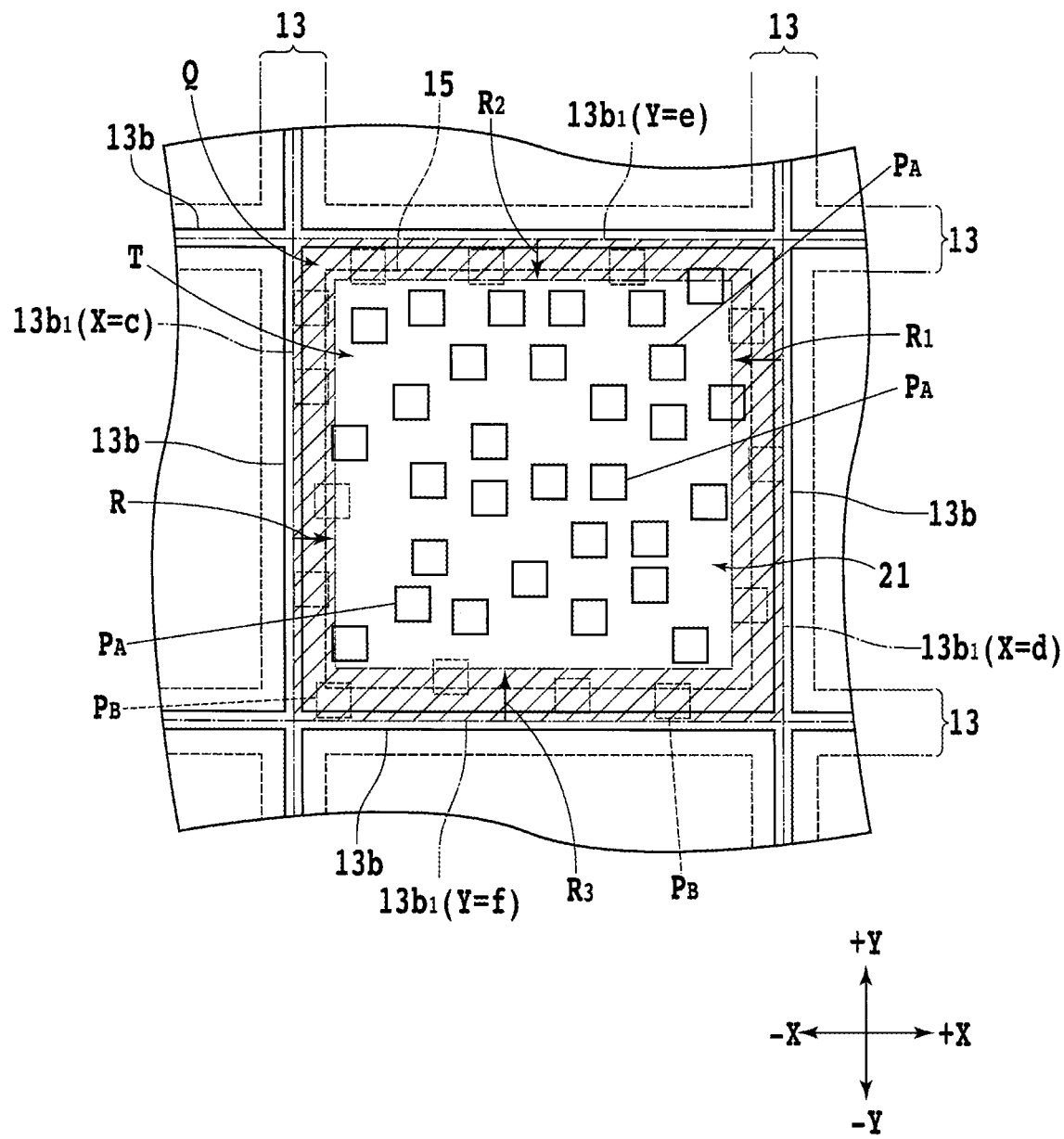
FIG. 10 is an enlarged fragmentary plan view schematically illustrating the thickness data unreferencing zone set in the setting step and a plurality of measurement points to be calculated in a calculating step of the measuring method.

FIG. 10 schematically illustrates, in enlarged fragmentary plan, the thickness data unreferencing zone Q that is set in setting step S50 and the measurement points $P_A$ that are positioned in the effective zone T and that are to be calculated in calculating step S60. After setting step S50, the calculating section 32 calculates an average value of the thicknesses at the measurement points $P_A$ except for the measurement points $P_B$ included in the thickness data unreferencing zone Q in each of the chips 21 (calculating step S60).

In calculating step S60, the calculating section S60 calculates an average value of the thicknesses at the measurement points $P_A$ except for the measurement points $P_B$ included in the thickness data unreferencing zone Q in one chip 21. Subsequently, in such processing as picking up of chips 21, each average value will be handled as the thickness of a corresponding one of the chips 21. In this manner, the calculating section 32 calculates an average value of the thicknesses at the measurement points $P_A$ that are present in the effective zone T. Moreover, the calculating section 32 calculates an average value of the thicknesses for each of the chips 21 on the wafer 11.

According to the present embodiment, since the thickness of each chip 21 can be calculated without involving the thicknesses in the vicinity of the projected dicing lines 13, the effect that the thicknesses of the outer peripheral portions of the chip 21 have is reduced, allowing the thickness of the chip 21 to be calculated more accurately than a case where the thicknesses at the projected dicing lines 13 are involved as part of the thickness of the chip 21. The structure, method, etc., according to the present embodiment can be changed or modified appropriately without departing from the scope of the present invention.

For example, if the wafer 11 has an orientation flat instead of the notch 11c, then the central position on a straight line represented by the orientation flat performs the same function as the notch 11c. Average values of the thicknesses of the chips 21, i.e., thicknesses of the chips 21, may be presented together with the overall diagram of the wafer 11 as illustrated in FIG. 6 to an operator by a display device, not illustrated. In addition, those chips 21 whose average thickness values fall out of an allowable range may be presented in an exaggerated or easily noticeable fashion to the operator, allowing the operator to recognize acceptable or unacceptable chips 21 clearly.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A measuring method for measuring thicknesses of a plurality of chips,
   the chips being produced by dividing a wafer along dividing grooves formed in and along a plurality of projected dicing lines on a face side of the wafer, the projected dicing lines each having a predetermined width and demarcating a plurality of areas in a grid form on the face side with devices constructed in the respective areas,
   the measuring method comprising:
   a holding step of holding face sides of the chips on a holding surface of a holding table with a protective member interposed therebetween;
   a first storing step of storing thickness data of each of the chips held on the holding surface, the thickness data being obtained by measurement of thicknesses of portions of the chip at a plurality of measurement points and representing the thicknesses measured at the measurement points in association with positions of the measurement points in a predetermined plane corresponding to a reverse side of the wafer;
   a second storing step of storing positions of central lines of the respective dividing grooves in the predetermined plane in captured images of reverse sides of the chips held on the holding surface;
   a setting step of setting, in a periphery of each of the chips, a thickness data unreferencing zone including measurement points that are positioned within predetermined distances from the positions of the central lines of corresponding ones of the dividing grooves and where the thickness data will not be referenced in calculating a thickness of the chip, on a basis of the thickness data of the chip; and
   a calculating step of calculating, for each of the chips, an average value of thicknesses at the measurement points except for the measurement points included in the thickness data unreferencing zone.

2. A measuring apparatus for measuring thicknesses of a plurality of chips,
   the chips being produced by dividing a wafer along dividing grooves formed in and along a plurality of projected dicing lines on a face side of the wafer, the projected dicing lines each having a predetermined width and demarcating a plurality of areas in a grid form on the face side with devices constructed in the respective areas,
   the measuring apparatus comprising:
   a holding table having a holding surface for holding thereon face sides of the chips with a protective member interposed therebetween;
   a thickness measuring unit for measuring, at a plurality of measurement points, thicknesses of portions of each of the chips held on the holding surface;
   an image capturing unit for capturing images of reverse sides of the chips held on the holding surface;
   a moving unit for moving the thickness measuring unit and the image capturing unit relatively to the holding table; and
   a controller having a processor and configured to control at least the holding table, the thickness measuring unit, the image capturing unit, and the moving unit,
   wherein the controller includes
      a storage section for storing thickness data of each of the chips, the thickness data representing the thicknesses measured at the measurement points in association with positions of the measurement points in a predetermined plane corresponding to a reverse side of the wafer, and positions of central lines of the respective dividing grooves in the predetermined plane in the images captured by the image capturing unit,
      a setting section for setting, in a periphery of each of the chips, a thickness data unreferencing zone including measurement points that are positioned within predetermined distances from the positions of the central lines of corresponding ones of the dividing grooves and where the thickness data will not be referenced in calculating a thickness of the chip, on a basis of the thickness data, and
      a calculating section for calculating, for each of the chips, an average value of thicknesses at the measurement points except for the measurement points included in the thickness data unreferencing zone.

* * * * *